US012550433B2

(12) United States Patent
Wang et al.

(10) Patent No.: US 12,550,433 B2
(45) Date of Patent: Feb. 10, 2026

(54) DISPLAY PANEL AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Cong Wang, Beijing (CN); Yingmeng Miao, Beijing (CN); Dongchuan Chen, Beijing (CN); Yanping Liao, Beijing (CN); Seungmin Lee, Beijing (CN); Xibin Shao, Beijing (CN); Jiantao Liu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 1020 days.

(21) Appl. No.: 17/639,305

(22) PCT Filed: Apr. 19, 2021

(86) PCT No.: PCT/CN2021/088059

§ 371 (c)(1),
(2) Date: Oct. 27, 2022

(87) PCT Pub. No.: WO2022/221985

PCT Pub. Date: Oct. 27, 2022

(65) Prior Publication Data

US 2024/0047469 A1 Feb. 8, 2024

(51) Int. Cl.
*H10D 86/60* (2025.01)
*H10D 86/40* (2025.01)

(52) U.S. Cl.
CPC ........... *H10D 86/60* (2025.01); *H10D 86/441* (2025.01); *G09G 2300/0426* (2013.01); *G09G 2310/0286* (2013.01)

(58) Field of Classification Search
CPC ... G09G 2300/0426; G09G 2310/0286; G09G 5/003; G09G 2310/0291; G09G 3/3611; G09G 3/3688; G11C 19/28; G02F 1/1345
See application file for complete search history.

(56) References Cited

U.S. PATENT DOCUMENTS 8,686,990 B2 * 4/2014 Yamamoto ............. G11C 19/28
345/98
10,186,230 B2 * 1/2019 Xue ..................... G09G 3/3674
(Continued)

FOREIGN PATENT DOCUMENTS

CN 103198802 A * 7/2013 ............... G06F 1/10
CN 107665662 A 2/2018
(Continued)

*Primary Examiner* — William B Partridge
*Assistant Examiner* — Alexander X Ramirez
(74) *Attorney, Agent, or Firm* — Nath, Goldberg & Meyer; Joshua B. Goldberg

(57) ABSTRACT

The embodiments of the present disclosure provide a display panel and a display device. The display panel includes: a display area and a bezel area located at the periphery of the display area; a plurality of gate lines extending from the display area to the bezel area; a plurality of shift registers located in the bezel area on at least one side of the display panel and connected to the plurality of gate lines in one-to-one correspondence. The plurality of shift registers on the bezel area on any one side of the display panel are divided into at least two groups sequentially arranged along a first direction away from the display area; the shift registers in each group are sequentially arranged along a second direction; and an angle between the second direction and the first direction is greater than 0°.

20 Claims, 14 Drawing Sheets

(56) References Cited

U.S. PATENT DOCUMENTS

| | | | | |
|---|---|---|---|---|
| 10,679,565 | B2 * | 6/2020 | Kim | H10D 86/60 |
| 10,950,322 | B2 * | 3/2021 | Fan | G09G 3/20 |
| 11,783,782 | B2 * | 10/2023 | Wang | G09G 3/3241 345/206 |
| 2012/0188211 | A1 * | 7/2012 | Tsai | G09G 3/20 345/205 |
| 2014/0098017 | A1 * | 4/2014 | Murakami | G11C 19/28 345/100 |
| 2016/0188087 | A1 | 6/2016 | Sun et al. | |
| 2019/0333433 | A1 * | 10/2019 | Zhu | G09G 3/20 |
| 2022/0114980 | A1 * | 4/2022 | Gao | G09G 3/3674 |
| 2022/0122503 | A1 * | 4/2022 | Xiao | G09G 3/2003 |

FOREIGN PATENT DOCUMENTS

| | | | |
|---|---|---|---|
| CN | 112435622 | A | 3/2021 |
| WO | 2016141652 | A1 | 9/2016 |
| WO | 2019096120 | A1 | 5/2019 |

* cited by examiner

DISPLAY PANEL AND DISPLAY DEVICE

This is a National Phase Application filed under 35 U.S.C. 371 as a national stage of PCT/CN2021/088059, filed Apr. 19, 2021, the content of which is hereby incorporated by reference in its entirety.

TECHNICAL FIELD

The embodiments of the present disclosure belong to the field of display technology, and in particular, relate to a display panel and a display device.

BACKGROUND

A Gate Driver on Array (GOA) technology can integrate a gate driving circuit onto an array substrate of a display panel to replace a driving chip made of an external silicon chip, so that a Gate Integrated Circuit (Gate IC) part and a fan-out wiring space can be omitted, thereby simplifying a structure of a display product and narrowing a bezel of the display product.

SUMMARY

The embodiments of the present disclosure provide a display panel and a display device.

In a first aspect, an embodiment of the present disclosure provides a display panel, including: a display area and a bezel area located at the periphery of the display area;

- a plurality of gate lines extending from the display area to the bezel area; and
- a plurality of shift registers located in the bezel area and on at least one side of the display panel and connected to the plurality of gate lines in one-to-one correspondence;
- the plurality of shift registers on any one side of the display panel are divided into at least two groups sequentially arranged along a first direction away from the display area; the shift registers in each group are sequentially arranged along a second direction; and
- an angle between the second direction and the first direction is greater than 0°.

In some embodiments, the display panel further includes a plurality of power signal lines and a plurality of control signal lines located in the bezel area and respectively electrically connected to the shift registers:

- the plurality of power signal lines are divided into at least two groups; in the bezel area on a side where the shift registers are located, each group of power signal lines is respectively located on a side of one corresponding group of shift registers, in one-to-one correspondence, away from the display area, and is electrically connected to the corresponding group of shift registers in one-to-one correspondence; and
- the plurality of control signal lines are divided into at least two groups; and in the bezel area on the side where the shift registers are located, each group of control signal lines is respectively located on a side of one corresponding group of shift registers, in one-to-one correspondence, away from the display area in one-to-one correspondence, and is electrically connected to the corresponding group of shift registers in one-to-one correspondence.

In some embodiments, in the bezel area on the side where the shift registers are located, the power signal lines and the control signal lines both extend along the second direction.

In some embodiments, input terminals of each group of power signal lines are electrically connected, and output terminals of each group of power signal lines are electrically connected; and

- input terminals of each group of control signal lines are electrically connected, and output terminals of each group of control signal lines are electrically connected.

In some embodiments, the display panel further includes a plurality of clock signal lines located in the bezel area and electrically connected to the shift registers, respectively; and

- on the side where the shift registers are located, the plurality of clock signal lines are located on one side of the shift registers away from the display area, and do not overlap the power signal lines and the control signal lines.

In some embodiments, in the bezel area on the side where the shift registers are located, the plurality of clock signal lines extend along the second direction.

In some embodiments, the plurality of shift registers in the bezel area on any one side of the display panel are divided into a first group and a second group sequentially arranged along the first direction away from the display area;

- the plurality of clock signal lines include a first set of clock signal lines and a second set of clock signal lines;
- in the bezel area on the side where the shift registers are located, different clock signal lines in the first set are respectively electrically connected to the shift registers in the second group through different first connection lines, respectively; and
- different clock signal lines in the second set respectively extend through gaps between every two adjacent shift registers in the second group and are respectively electrically connected to the shift registers in the first group, through different second connection lines in one-to-one correspondence.

In some embodiments, the first connection line includes a first body part and a first compensation part which are connected; the first body part is a straight line extending along the first direction; the first compensation part is a curved line with a general trend extending along the first direction; and

- the first compensation parts of different first connection lines have a substantially same length.

In some embodiments, the second connection line is a straight line extending along the first direction; and

- the first connection line and the second connection line have a substantially same length.

In some embodiments, the first compensation part is located in a gap between the power signal line, the control signal line, and the clock signal line, which are electrically connected to the second group of shift registers.

In some embodiments, each shift register in the first group is electrically connected to a corresponding gate line through a different first output line; and

- each shift register in the second group respectively extends through a gap between two adjacent shift registers in the first group and is electrically connected to a corresponding gate line, through a different second output line in one-to-one correspondence.

In some embodiments, the first output line includes a second body part and a second compensation part which are connected; the second body part is a straight line extending along the first direction; the second compensation part is a curve with a general trend extending along the first direction; and

- the second compensation parts of different first output lines have a substantially same length.

In some embodiments, the second output line is a straight line extending along the first direction; and the first output line and the second output line have a substantially same length.

In some embodiments, the second compensation part is located in a gap between the first group of shift registers and the display area.

In some embodiments, the plurality of shift registers are distributed in a bezel area on a first side of the display area;

the plurality of shift registers include odd-numbered shift registers and even-numbered shift registers;

the first group of shift registers includes the even-numbered shift registers, and the second group of shift registers includes the odd-numbered shift registers;

the display panel further includes a plurality of pixels located in the display area and arranged in an array;

the plurality of gate lines includes a plurality of first gate lines and a plurality of second gate lines;

in the array, odd-numbered pixels in each row are connected to one first gate line, and even-numbered pixels in each row are connected to one second gate line; and the odd-numbered shift registers are connected to one ends of the first gate lines; and the even-numbered shift registers are connected to one ends of the second gate lines.

In some embodiments, the plurality of shift registers are further distributed in a bezel area on a second side of the display area;

the bezel area on the first side is opposite to the bezel area on the second side;

the plurality of shift registers distributed in the bezel area on the first side and the plurality of shift registers distributed in the bezel area on the second side are mirror-symmetrical by taking the display area as a symmetry axis; and the odd-numbered shift registers distributed in the bezel area on the second side are connected to other ends of the first gate lines; and the even-numbered shift registers distributed in the bezel area on the second side are connected to other ends of the second gate lines.

In some embodiments, the plurality of power signal lines are distributed in the bezel area on the first side and the bezel area on the second side; the plurality of control signal lines are distributed in the bezel area on the first side and the bezel area on the second side;

the plurality of power signal lines distributed in the bezel area on the first side and the plurality of power signal lines distributed in the bezel area on the second side are mirror-symmetrical by taking the display area as a symmetry axis; and the control signal lines distributed in the bezel area on the first side and the control signal lines distributed in the bezel area on the second side are mirror-symmetrical by taking the display area as a symmetry axis.

In some embodiments, the plurality of clock signal lines are distributed in the bezel area on the first side and the bezel area on the second side; and the plurality of clock signal lines distributed in the bezel area on the first side and the plurality of clock signal lines distributed in the bezel area on the second side are mirror-symmetrical by taking the display area as a symmetry axis.

In some embodiments, the first connection lines, the second connection lines, the first output lines and the second output lines are respectively distributed in the bezel area on the first side and the bezel area on the second side;

the first connection lines distributed in the bezel area on the first side and the first connection lines distributed in the bezel area on the second side are mirror-symmetrical by taking the display area as a symmetry axis;

the second connection lines distributed in the bezel area on the first side and the second connection lines distributed in the bezel area on the second side are mirror-symmetrical by taking the display area as a symmetry axis;

the first output lines distributed in the bezel area on the first side and the first output lines distributed in the bezel area on the second side are mirror-symmetrical by taking the display area as a symmetry axis; and the second output lines distributed in the bezel area on the first side and the second output lines distributed in the bezel area on the second side are mirror-symmetrical by taking the display area as a symmetry axis.

In a second aspect, an embodiment of the present disclosure further provides a display device, including the above display panel.

BRIEF DESCRIPTION OF DRAWINGS

The drawings are used to provide further understanding of the present disclosure, constitute a part of specification, explain the present disclosure with the embodiments of the present disclosure, but do not constitute limitation on the present disclosure. The above and other features and advantages will become more apparent to those skilled in the art by describing exemplary embodiments in detail with reference to the drawings. In the drawings.

DETAIL DESCRIPTION OF EMBODIMENTS

Figure 1:
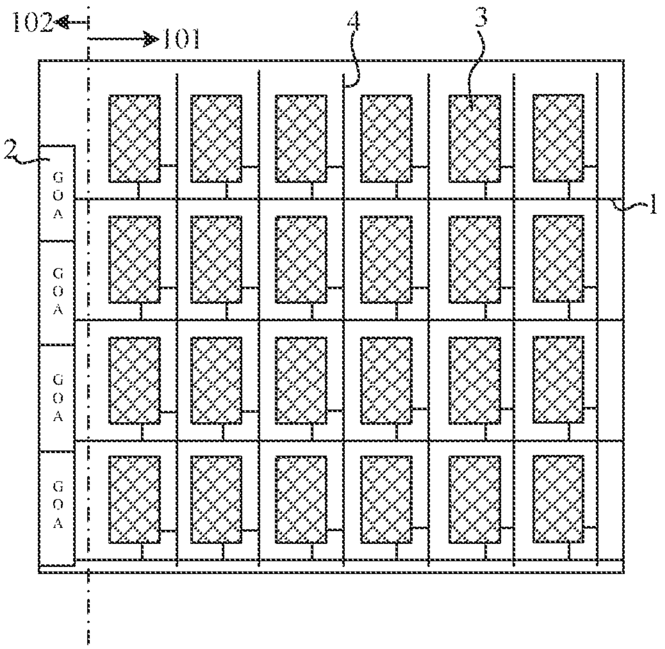
FIG. 1 is a schematic top view illustrating distribution of shift registers in a gate driving circuit of a display panel.

To enable those skilled in the art to better understand the technical solutions of the present disclosure, a display panel and a display device provided by the embodiments of the present disclosure are further described in detail below with reference to the drawings and the specific embodiments.

The embodiments of the present disclosure will be described more fully below with reference to the drawings, but the embodiments shown herein may be implemented in different forms and should not be construed as limitation on the present disclosure. On the contrary, the embodiments are provided to make the present disclosure thorough and complete and to enable those skilled in the art to fully understand the scope of the present disclosure.

The embodiments of the present disclosure are not limited to the embodiments shown in the drawings, and include modifications of configuration formed based on a manufacturing process. Thus, exemplary areas illustrated in the drawings have schematic properties, and the shape of the area shown in the drawings illustrates the specific shape of the area, but is not restrictive.

In the existing art, referring to FIG. 1, a display panel generally includes a display area 101 and a bezel area 102 located at the periphery of at least one side of the display area 101. The display area 101 is provided with a plurality of pixels 3 arranged in an array therein, the pixels 3 in a same row are connected to a same gate line 1, and the pixels 3 in a same column are connected to a same data line 4. The bezel area 102 is provided with a gate driving circuit therein, and the gate driving circuit includes a plurality of cascaded shift registers (GOAs, Gate on Array) 2, and the shift registers 2 are disposed in one-to-one correspondence with the gate lines 1, that is, each shift register 2 is connected to one gate line 1. When each frame of image is displayed, the shift registers 2 output gate scanning signals to the corresponding gate lines 1 stage by stage, so as to complete scanning of the pixels 3 line by line; and while each gate line 1 is scanned, each data line 4 writes a data voltage signal into the pixels 3 of the line, so as to turn on the pixels 3 of the line.

Figure 2:
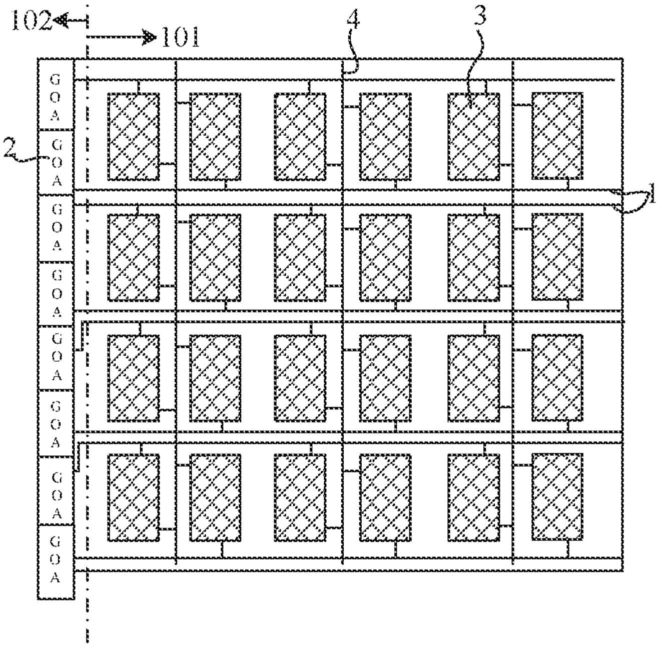
FIG. 2 is a schematic top view illustrating distribution of shift registers in a display panel with a dual-gate driving mode.

Referring to FIG. 1, the shift registers 2 are disposed in the bezel area 102 on one side of the display panel and are sequentially arranged along a column direction of a pixel array, so that each shift register 2 is electrically connected to the corresponding gate line 1. However, for a 55-inch or 65-inch display panel with relatively high resolution (e.g., 8 k resolution), dual-gate driving is generally used to reduce manufacturing cost. Referring to FIG. 2, dual-gate driving refers to that each row of pixels 3 in the pixel array is respectively scanned by two gate lines 1, for example, the two gate lines 1 are located respectively on upper and lower sides of one row of pixels 3 along the column direction of the array; odd-numbered pixels 3 in each row are connected to one gate line 1, and even-numbered pixels 3 in each row are connected to another gate line 1; and one data line 4 may be connected to two columns of pixels 3. Thus, the number of data driving chips (source ICs) is reduced, thereby reducing the manufacturing cost of the display panel.

However, for a dual-gate driving display panel with relatively high resolution, since the shift registers 2 are in one-to-one correspondence with the gate lines 1, an increase in the number of the gate lines 1 results in an increase in the number of the shift registers 2. For example, for a dual-gate driving display panel with 8 k resolution, the number of the shift registers 2 may reach 8640. If the shift registers 2 are arranged in a manner shown in FIG. 1 in which shift registers are sequentially arranged along the column direction of the pixel array, the bezel area 102 on one side of the display panel does not have enough space to accommodate such a large number of shift registers 2, so that the arrangement manner of the shift registers 2 in FIG. 1 cannot meet an arrangement requirement.

Figure 3:
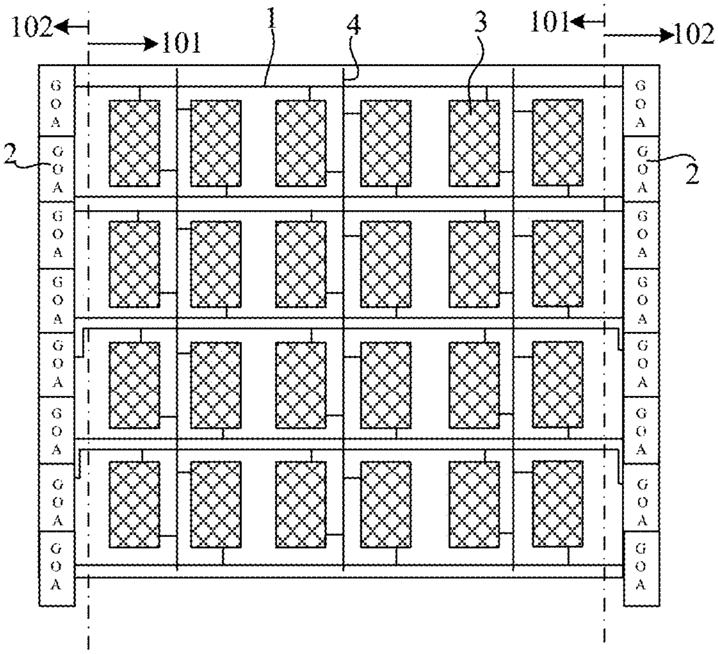
FIG. 3 is a schematic top view illustrating distribution of shift registers in a display panel with a dual-gate and dual-side driving mode.

In addition, for the 55-inch or 65-inch display panel with relatively high resolution (e.g., 8 k resolution), dual-side driving is generally used to ensure brightness uniformity of the display image. Referring to FIG. 3, dual-side driving refers to that each gate line 1 is correspondingly connected to two shift registers 2, and the two shift registers 2 are disposed in the bezel areas 102 respectively on two opposite sides of the display panel, and are respectively connected to two ends of a same gate line 1. When driving is performed, two shift registers 2 simultaneously input a gate scanning signal to one gate line 1 from two ends, thereby achieving the dual-side driving of the gate line 1. Compared with the solution in which the shift register 2 inputs a signal from one end of the gate line 1 to perform single-side driving on the gate line 1, the dual-side driving can effectively avoid signal attenuation in the process of transmitting the gate scanning signal from one end of the gate line 1 to the other end of the gate line 1, thereby ensuring consistency of the gate scanning signal and consequently improving the brightness uniformity of the display image of the display panel.

The dual-side driving requires that the same number of shift registers 2 are disposed in the bezel areas 102 on each of two opposite sides of the display panel, and the number of the shift registers 2 in the bezel area 102 on each side of the display panel is the same as that of the gate lines 1; for example, for a dual-gate and dual-side driving display panel with 8 k resolution, each of the bezel areas 102 on two opposite sides of the display pane has 8640 shift registers. If the shift registers 2 are arranged in a manner shown in FIG. 1 in which shift registers are sequentially arranged along the column direction of the pixel array in FIG. 1, the bezel areas 102 on two opposite sides of the display panel both do not have enough space to accommodate such a large number of shift registers 2, resulting in that the arrangement manner of the shift registers 2 in FIG. 1 cannot meet the arrangement requirement.

With regard to the problem that there is no enough arrangement space according to the current arrangement manner due to a large number of shift registers, and thus the arrangement requirement cannot be satisfied, the embodiments of the present disclosure provide the following technical solution.

Figure 4:
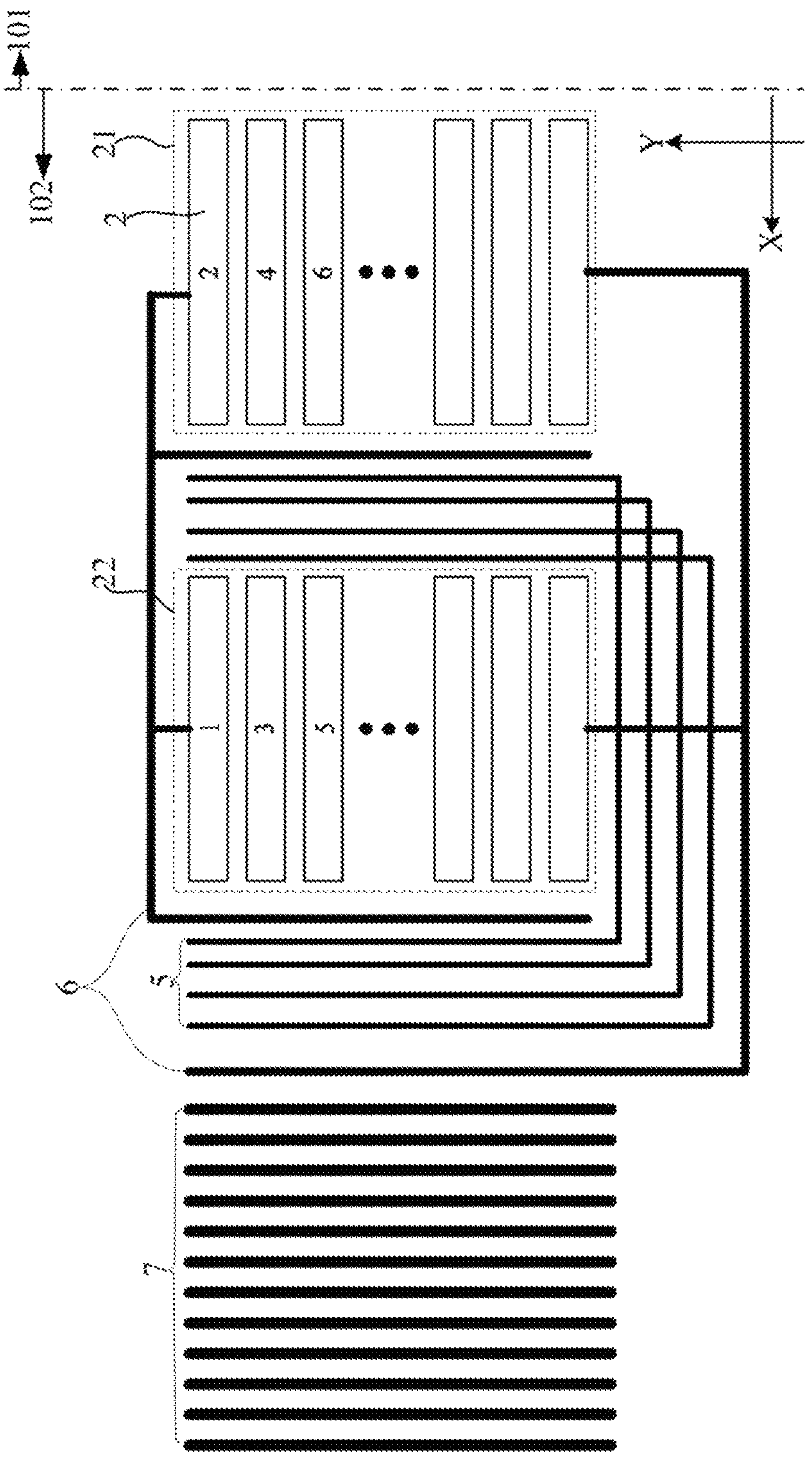
FIG. 4 is a schematic top view illustrating distribution of shift registers and signal lines in a bezel area of a display panel according to an embodiment of the present disclosure.
Figure 5:
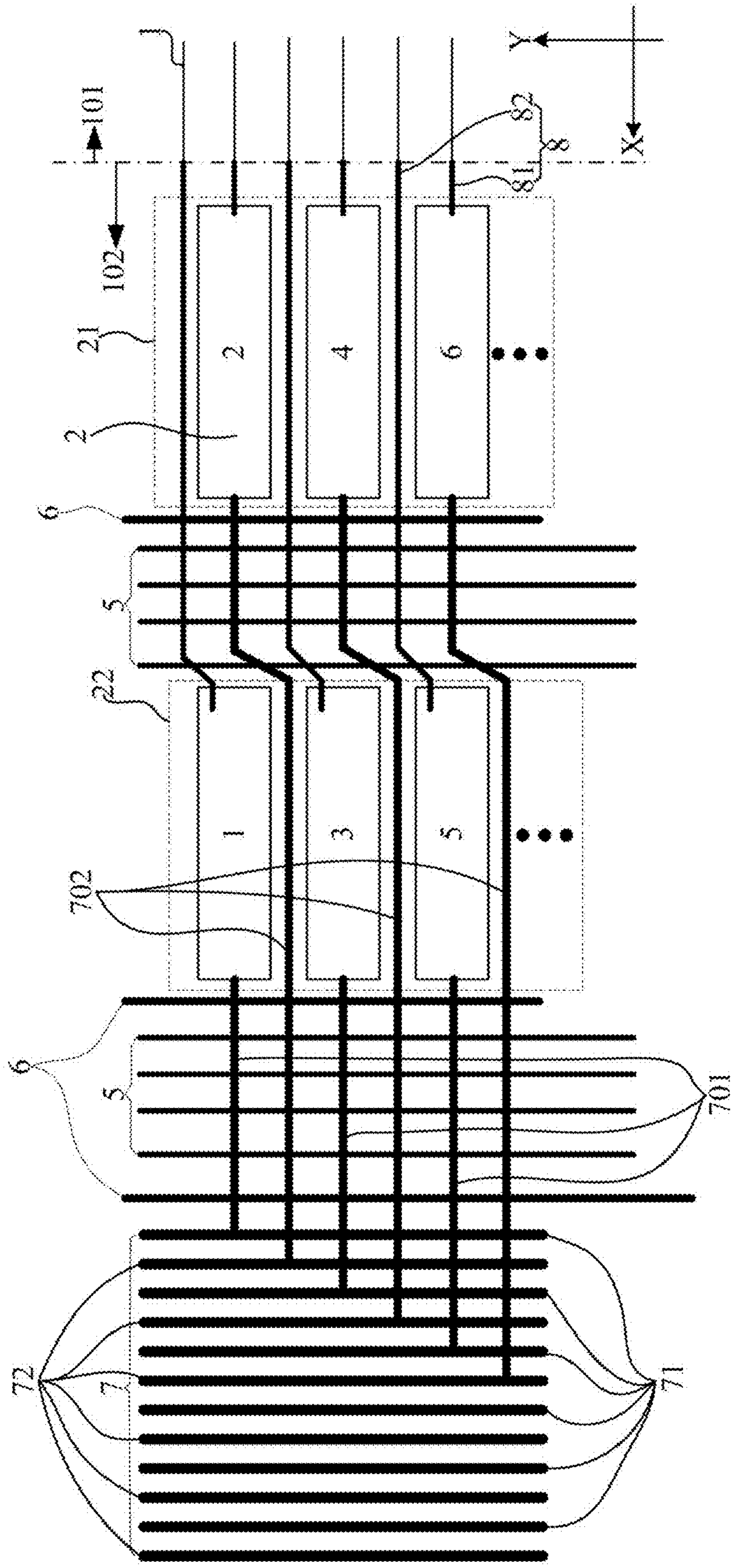
FIG. 5 is a schematic top view illustrating distribution and connection of shift registers and signal lines in a bezel area of a display panel according to an embodiment of the present disclosure.

In a first aspect, an embodiment of the present disclosure provides a display panel. Referring to FIG. 4 and FIG. 5, the display panel includes: a display area 101 and a bezel area 102 located at the periphery of the display area 101; a plurality of gate lines 1 extending from the display area 101 to the bezel area 102; and a plurality of shift registers 2 located in the bezel area 102 on at least one side of the display panel and connected to the plurality of gate lines 1 in one-to-one correspondence. The plurality of shift registers 2 in the bezel area 102 on any one side are divided into at least two groups sequentially arranged along a first direction X away from the display area 101; the shift registers 2 in each group are sequentially arranged along a second direction Y; and an angle between the second direction Y and the first direction X is greater than 0°.

In the embodiment, the shift registers 2 located in the bezel area 102 on any one side of the display panel are grouped, all groups of shift registers in the bezel area 102 on any one side are sequentially arranged along the first direction X away from the display area 101, and the shift registers 2 in each group are sequentially arranged along the second direction Y. With such arrangement, it can be ensured that the bezel area 102 has enough space to accommodate a large number of shift registers 2, thereby avoiding a case where the bezel area 102 has insufficient space when the large number of shift registers 2 are arranged according to the arrangement manner in FIG. 1, and satisfying the arrangement requirement of the large number of shift registers 2 in the bezel area 102.

In some embodiments, the plurality of shift registers 2 in the bezel area 102 on any one side are divided into a first group 21 and a second group 22 sequentially arranged along the first direction X away from the display area 101.

Figure 6:
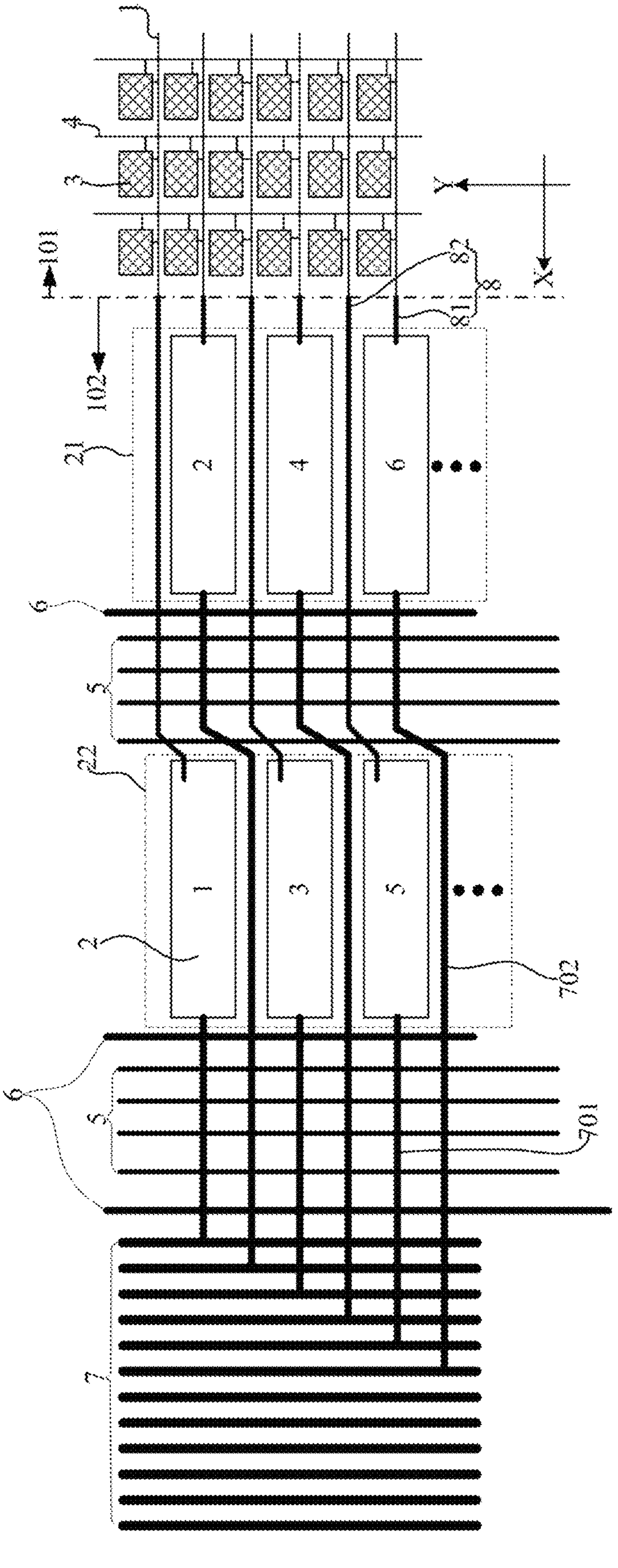
FIG. 6 is a schematic top view illustrating a display panel with a single-gate and single-side driving mode according to an embodiment of the present disclosure.

In some embodiments, referring to FIG. 6, the plurality of shift registers 2 are distributed in the bezel area 102 on a first side of the display area 101, and include a group having odd-numbered shift registers and a group having even-numbered shift registers; a first group of shift registers 2 includes the even-numbered shift registers, and a second group of shift registers includes the odd-numbered shift registers; the display panel further includes a plurality of pixels 3 located in the display area 101 and arranged in an array; the plurality of gate lines 1 include a plurality of odd-numbered gate lines and a plurality of even-numbered gate lines; any odd-numbered gate line and any even-numbered gate line are respectively connected to a row of pixels 3; and each odd-numbered shift register is connected to a corresponding one of the odd-numbered gate lines, and each even-numbered shift register is connected to a corresponding one of the even-numbered gate lines. In some embodiments, the display panel further includes a plurality of data lines 4 respectively extending along a column direction of the array, and each data line 4 is connected to one corresponding column of pixels 3. That is, in the embodiment, the display panel is in a common single-gate driving and single-side driving mode.

The pixel 3 may be a pixel unit in a liquid crystal display panel, and the pixel unit includes at least a pixel driving circuit, and a sub-pixel composed of one pixel electrode on a lower substrate, a common electrode on an upper substrate, and liquid crystal filled between the upper substrate and the lower substrate; alternatively, the pixel unit includes at least a pixel driving circuit, and one light-emitting element composed of an anode, a light-emitting functional layer, and a cathode provided on a substrate. The light-emitting functional layer may be an organic electroluminescent functional layer or an inorganic light-emitting layer. The pixel driving circuit is connected to the gate lines and the data lines, and is electrically connected to the sub-pixel or the light-emitting element; and the pixel driving circuit supplies a data signal on the data line to the sub-pixel or the light-emitting element under the control of a gate scanning signal on the gate line, so that the sub-pixel or the light-emitting element emits light with different brightness, thereby achieving the image display of the whole display panel.

In some embodiments, referring to FIG. 4 and FIG. 5, the display panel further includes a plurality of power signal lines 5 and a plurality of control signal lines 6 located in the bezel area 102 and respectively electrically connected to the shift registers 2; the plurality of power signal lines 5 are divided into at least two groups; in the bezel area 102 on the side where the shift registers 2 are located, each group of power signal lines 5 is respectively located on one side of each group of shift registers 2 away from the display area 101 in one-to-one correspondence, and is respectively electrically connected to each group of shift registers 2 in one-to-one correspondence; the plurality of control signal lines 6 are divided into at least two groups; and in the bezel area 102 on the side where the shift registers 2 are located, each group of control signal lines 6 is respectively located on one side of each group of shift registers 2 away from the display area 101 in one-to-one correspondence, and is respectively electrically connected to each group of shift registers 2 in one-to-one correspondence.

In some embodiments, in the bezel area 102 on the side where the shift registers 2 are located, the power signal lines 5 and the control signal lines 6 both extend along the second direction Y.

The above arrangement of the power signal lines 5 and the control signal lines 6 enables each of each group of power signal lines 5 and each group of control signal lines 6 to be located in a gap between one group of shift registers 2 electrically connected thereto and another adjacent group of shift registers 2, so that the arrangement of the power signal lines 5 and the control signal lines 6 relative to the shift registers 2 electrically connected thereto is more compact and reasonable, which is not only beneficial to the reduction of the occupied space for arrangement so as to effectively utilize the space of the bezel area 102, but also beneficial to electric connection between each of each group of power signal lines 5 and each group of control signal lines 6 and one corresponding group of shift registers 2.

In some embodiments, input terminals of each group of power signal lines 5 are electrically connected, and output terminals of each group of power signal lines 5 are electrically connected; and input terminals of each group of control signal lines 6 are electrically connected, and output terminals of each group of control signal lines 6 are electrically connected. With such arrangement, it can be ensured that the grouped power signal lines 5 supply a same power signal to the shift registers 2, thereby ensuring that the shift registers 2 can stably operate under the given power signal; and similarly, it can be ensured that the grouped control signal lines 6 supply a same control signal to the shift registers 2, thereby ensuring that the shift registers 2 can stably operate under the given control signal.

Figure 7:
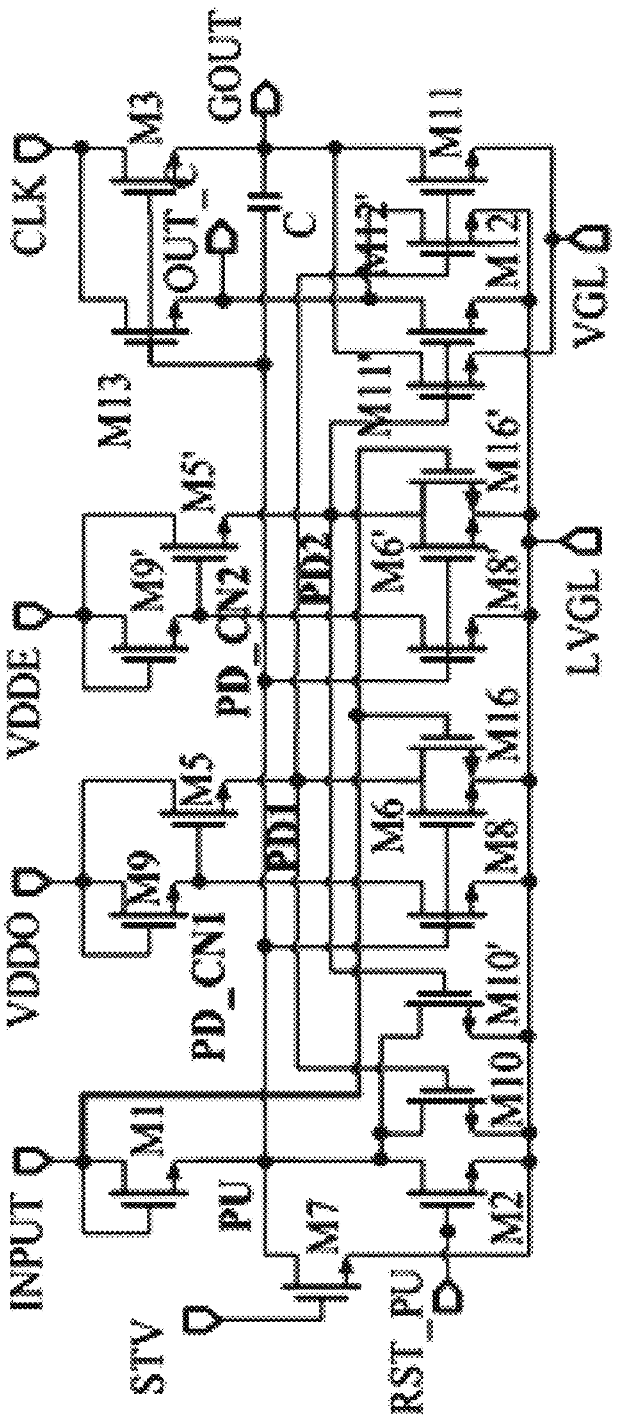
FIG. 7 is a circuit diagram of a shift register according to an embodiment of the present disclosure.
Figure 8:
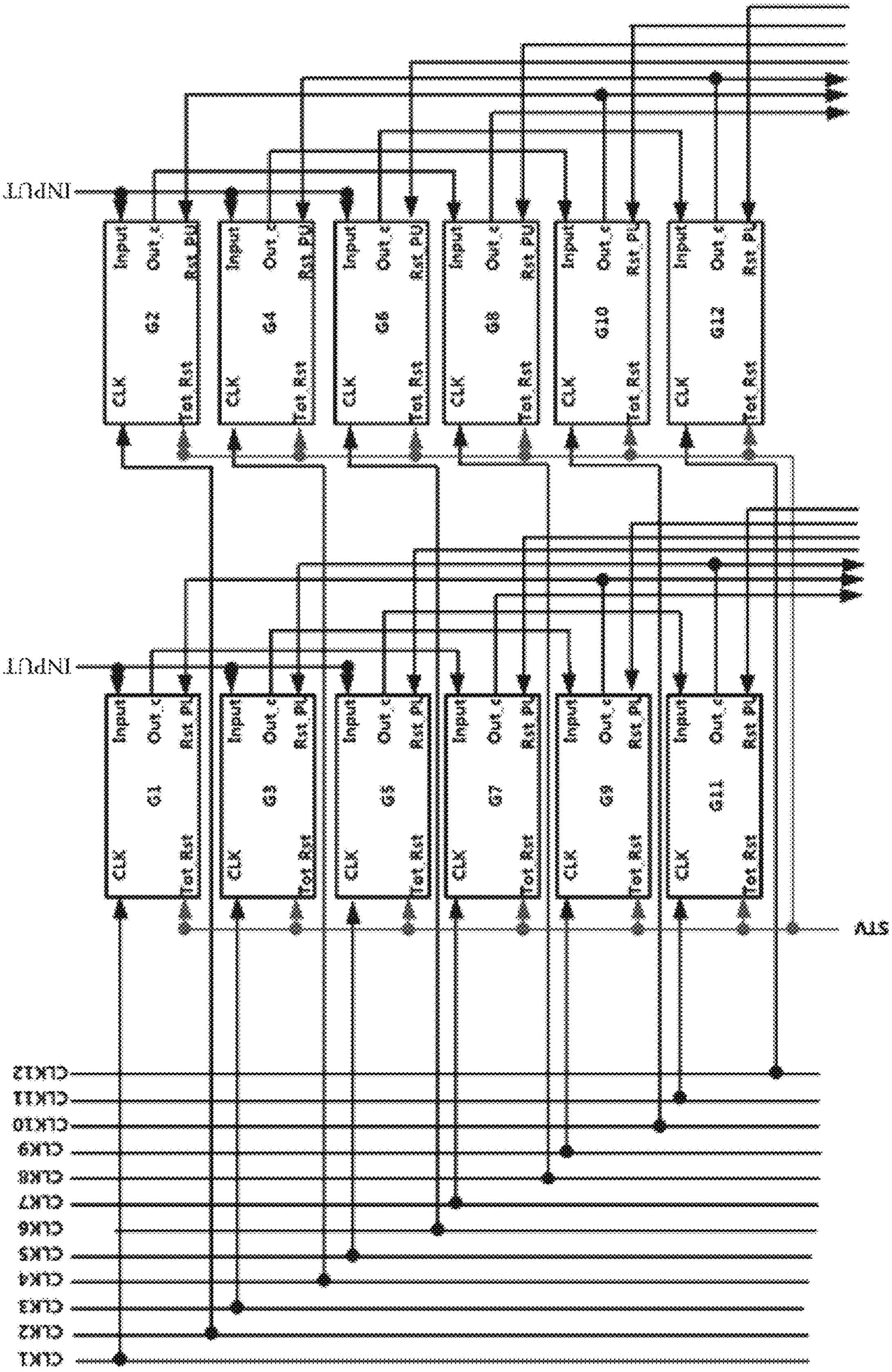
FIG. 8 is a schematic diagram of a gate driving circuit formed by cascading the shift registers in FIG. 7.

For example, referring to FIG. 7 that is a circuit diagram of a shift register 2 in a display panel, the shift register 2 uses a twenty one-transistors-one-capacitor (21T1C) circuit, in which VDDO, VDDE, LVGL. VGL are power signal lines 5 for supplying a constant power signal to the shift register 2 in the display process of the display panel, and STV and INPUT are control signal lines 6 for supplying a trigger control signal to the shift register 2 in the display process of the display panel. Referring to FIG. 8 that is a schematic diagram of a gate driving circuit formed by cascading the shift registers 2 in FIG. 7, and referring to FIG. 9 that is an operation timing diagram of the gate driving circuit in FIG. 8, VDDO supplies a constant high-potential voltage signal to the circuit of the shift register 2 in the display process of the display panel, VDDE supplies a constant low-potential voltage signal to the circuit of the shift register 2 in the display process of the display panel, VGL supplies a constant low-potential voltage signal to the circuit of the shift register 2 in the display process of the display panel, LVGL supplies another constant low-potential voltage signal to the circuit of the shift register 2 in the display process of the display panel, STV supplies a trigger pulse signal to the circuit of the shift register 2 at the beginning and the end of display of one frame of image in the display panel, and INPUT supplies a pulse control signal to the circuit of the shift register 2 at the beginning of the display of one frame of image in the display panel.

In some embodiments, the circuit of the shift register 2 may be any circuit capable of implementing the function of the shift register 2. The circuit of the shift register 2 is not improved in the embodiment of the present disclosure, and thus is not listed one by one here.

In some embodiments, referring to FIG. 4 and FIG. 5, the display panel further includes a plurality of clock signal lines 7 located in the bezel area 102 and respectively electrically connected to the shift registers; and in the bezel area 102 on the side where the shift registers 2 are located, the plurality of clock signal lines 7 are located on one side of the shift registers 2 away from the display area 101, and do not overlap the power signal lines 5 and the control signal lines 6. The clock signal line 7 supplies a clock signal to the shift register 2 when the shift register operates.

In some embodiments, in the bezel area 102 on the side where the shift registers 2 are located, the plurality of clock signal lines 7 extend along the second direction Y.

Figure 9:
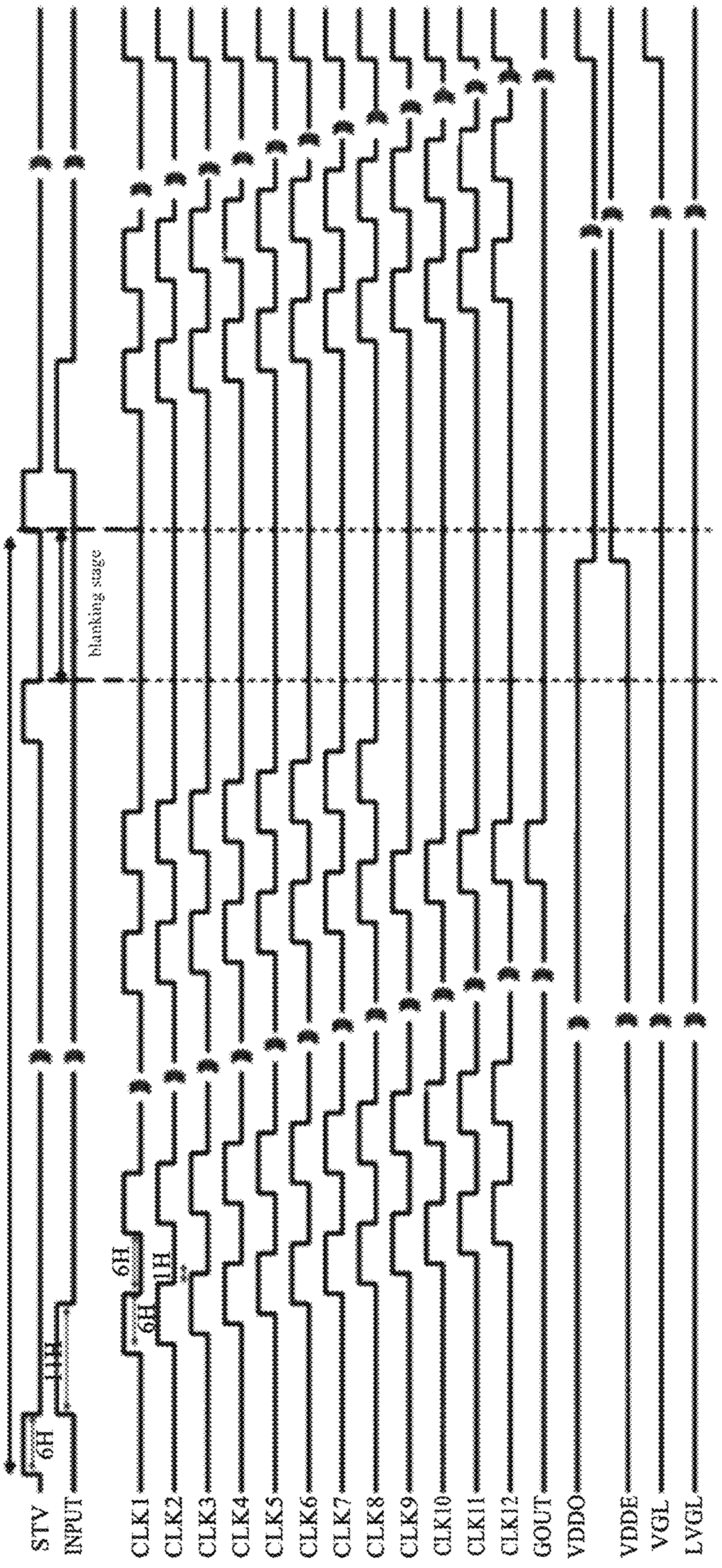
FIG. 9 is an operation timing diagram of the gate driving circuit in FIG. 8.

Referring to FIG. 9, since a plurality of continuous pulse signals are transmitted through the clock signal lines 7, when there are dense areas or locations where the clock signal lines 7 overlap or cross the power signal lines 5, the control signal lines 6, and the gate scanning signal output lines 8 of the shift registers 2, the plurality of continuous pulse signals are easily interfered by signals on other signal lines, which affects normal and stable operation of the shift registers 2. Compared with the case where each of the clock signal lines 7 electrically connected to a different group of shift registers 2 is arranged in a gap between the group of shift registers 2 connected to the clock signal line and another adjacent group of shift registers 2, the above arrangement of the clock signal lines 7 can avoid the clock signal lines 7 from overlapping or crossing the power signal lines 5, the control signal lines 6, and the gate scanning signal output lines 8 of the shift registers 2 to a greatest extent, so as to avoid the clock signals on the clock signal lines 7 being interfered by the signals on the power signal lines 5, the control signal lines 6, and the gate scanning signal output lines 8 of the shift registers 2, thereby ensuring stability of the clock signals on the clock signal lines 7; meanwhile, the clock signal lines 7 are arranged more compactly and reasonably in above manner, so that the space of the bezel area 102 can be effectively utilized.

In some embodiments, referring to FIG. 5 and FIG. 8, the plurality of shift registers 2 in the bezel area 102 on any one side of the display panel are divided into a first group 21 and a second group 22 sequentially arranged along the first direction X away from the display area 101; the plurality of clock signal lines 7 include a first set 71 of clock signal lines and a second set 72 of clock signal lines; in the bezel area 102 on the side where the shift registers 2 are located, different clock signal lines 7 in the first set 71 are electrically connected to the shift registers 2 in the second group 22 through different first connection lines 701, respectively; and different clock signal lines 7 in the second set 72 respectively extend through gaps between every two adjacent shift registers 2 in the second group 22 and are electrically connected to the shift registers 2 in the first group 21, via different second connection lines 702 in one-to-one correspondence. With such arrangement, the second connection lines 702 can be arranged more compactly and reasonably, so that the space of the bezel area 102 can be effectively utilized.

For example, referring to FIG. 4, FIG. 5 and FIG. 8, twelve clock signal lines 7 are disposed in the display panel. In some embodiments, the number of the clock signal lines 7 in the display panel may be eight, four, two, or the like, and may be set according to the requirement of the shift registers 2 cascaded in the gate driving circuit.

Figure 10:
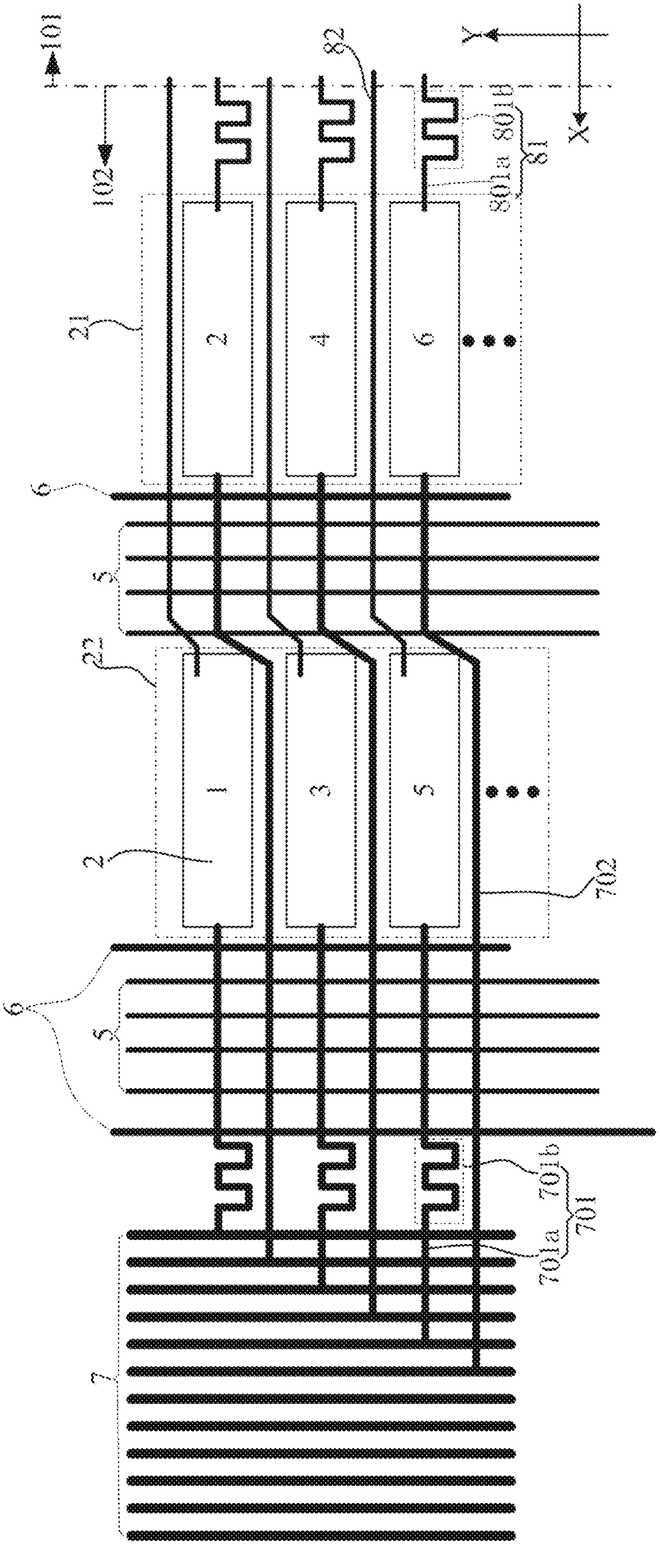
FIG. 10 is a schematic top view illustrating distribution and compensation of shift registers and signal lines in a bezel area of a display panel according to an embodiment of the present disclosure.

In some embodiments, referring to FIG. 10, the first connection line 701 includes a first body part **701*a* and a first compensation part 701*b* which are connected; the first body part 701*a* is a straight line extending along the first direction X; the first compensation part 701*b* is a curved line with an overall trend extending along the first direction X; and the first compensation parts 701*b* of different first connection lines 701** have a substantially same length.

In some embodiments, the second connection line 702 is a straight line extending along the first direction X; and the first connection line 701 and the second connection line 702 have a substantially same length. A distance of connection between the second set of clock signal lines and the first group of shift registers is longer than a distance of connection between the first set of clock signal lines and the second group of shift registers, and thus a wiring length of the second connection line 702 is longer than that of the first connection line 701. Different wiring lengths result in different wiring resistances, and thus the wiring resistance of the second connection line 702 is greater than that of the first connection line 701. As a result, attenuation of a pulse signal with a same magnitude when transmitted through the second connection line 702 is obviously greater than that when transmitted through the first connection line 701, and ultimately, the plurality of clock signal lines 7 have different magnitudes of clock signals as a consequence, thereby affecting stability and magnitude consistency of the gate scanning signals output by the shift registers 2. By arranging the first compensation part **701*b* for the first connection line 701, the wiring length of the first connection line 701 can be compensated to be substantially the same as that of the second connection line 702, so that the difference in wiring resistance caused by different wiring lengths is reduced or avoided, and consequently, the magnitudes of the clock signals on the plurality of clock signal lines 7 tend to be consistent, and finally the stability and the magnitude consistency of the gate scanning signals output by the shift registers 2** are ensured.

By making the lengths of the first compensation parts **701*b* of different first connection lines 701 substantially the same, the lengths of the first connection lines 701 can be compensated to be substantially the same, so that the difference in wiring resistance caused by different wiring lengths is reduced or avoided, and consequently, the magnitudes of the clock signals on the plurality of clock signal lines 7 tend to be consistent, and finally the stability and the magnitude consistency of the gate scanning signals output by the shift registers 2** are ensured.

In some embodiments, the first compensation part **701*b* is located in a gap between the power signal line 5, the control signal line 6 and the clock signal line 7, which are correspondingly electrically connected to the second group of shift registers. With the location arrangement of the first compensation parts 701*b*, the first compensation parts 701*b* do not overlap or cross the power signal lines 5, the control signal lines 6, and the gate scanning signal output lines 8 of the shift registers 2, so that the clock signals transmitted in the first compensation parts 701*b* are not interfered by the signals transmitted in the power signal lines 5, the control signal lines 6, and the gate scanning signal output lines 8 of the shift registers 2, thereby ensuring the stability of the clock signals transmitted in the first compensation parts 701***b*; meanwhile, the first compensation parts 701*b* are arranged more compactly and reasonably in above manner, so that the space of the bezel area 102 can be effectively utilized.

In some embodiments, referring to FIG. 4 and FIG. 5, each shift register 2 in the first group 21 is electrically connected to a corresponding gate line 1 through a different first output line 81, respectively; and each shift register 2 in the second group 22 extends through a gap between two adjacent shift registers 2 in the first group 21 in one-to-one correspondence and is electrically connected to a corresponding gate line 1, through a different second output line 82, respectively. The first output line 81 and the second output line 82 both are the gate scanning signal output lines 8. With such arrangement, the second output lines 82 can be arranged more compactly and reasonably, so that the space of the bezel area 102 can be effectively utilized.

In some embodiments, referring to FIG. 10, the first output line 81 includes a second body part 801*a* and a second compensation part 801*b* which are connected, the second body part 801*a* is a straight line extending along the first direction X; the second compensation part 801*b* is a curved line with a general trend extending along the first direction X; and the second compensation parts 801*b* of different first output lines 81 have a substantially same length.

In some embodiments, the second output line 82 is a straight line extending along the first direction X; and the first output line 81 and the second output line 82 have a substantially same length. A distance of connection between the second output line 82 and a corresponding gate line is longer than a distance of connection between the first output line 81 and a corresponding gate line, and thus a wiring length of the second output line 82 is longer than that of the first output line 81. Different wiring lengths result in different wiring resistances, and thus the wiring resistance of the second output line 82 is greater than that of the first output line 81. As a result, attenuation of a gate scanning signal when transmitted through the second output line 82 is obviously greater than that when transmitted through the first output line 81, and ultimately, the plurality of gate scanning signal output lines 8 have different magnitudes of gate scanning signals, thereby affecting stability of the gate scanning signals output by the shift registers 2. By arranging the second compensation part 801*b* for the first output line 81, the wiring length of the first output line 81 can be compensated to be substantially the same as that of the second output line 82, so that the difference in wiring resistance caused by different wiring lengths is reduced or avoided, and thus, the magnitudes of the gate scanning signals on the plurality of gate scanning signal output lines 8 tend to be consistent, and finally the stability of the gate scanning signals output by the shift registers 2 is ensured.

By arranging the lengths of the second compensation parts 801*b* of different first output lines 81 substantially the same, the lengths of the first output lines 81 can be compensated to be substantially the same, so that the difference in wiring resistance caused by different wiring lengths is reduced or avoided, and thus, the magnitudes of the gate scanning signals on the plurality of gate scanning signal output lines 8 tend to be consistent, and finally the stability of the gate scanning signals output by the shift registers 2 is ensured.

In some embodiments, the second compensation part 801*b* is located in a gap between the first group of shift registers and the display area 101. The second compensation parts 801*b* are arranged more compactly and reasonably in above manner, so that the space of the bezel area 102 can be effectively utilized.

Figure 11:
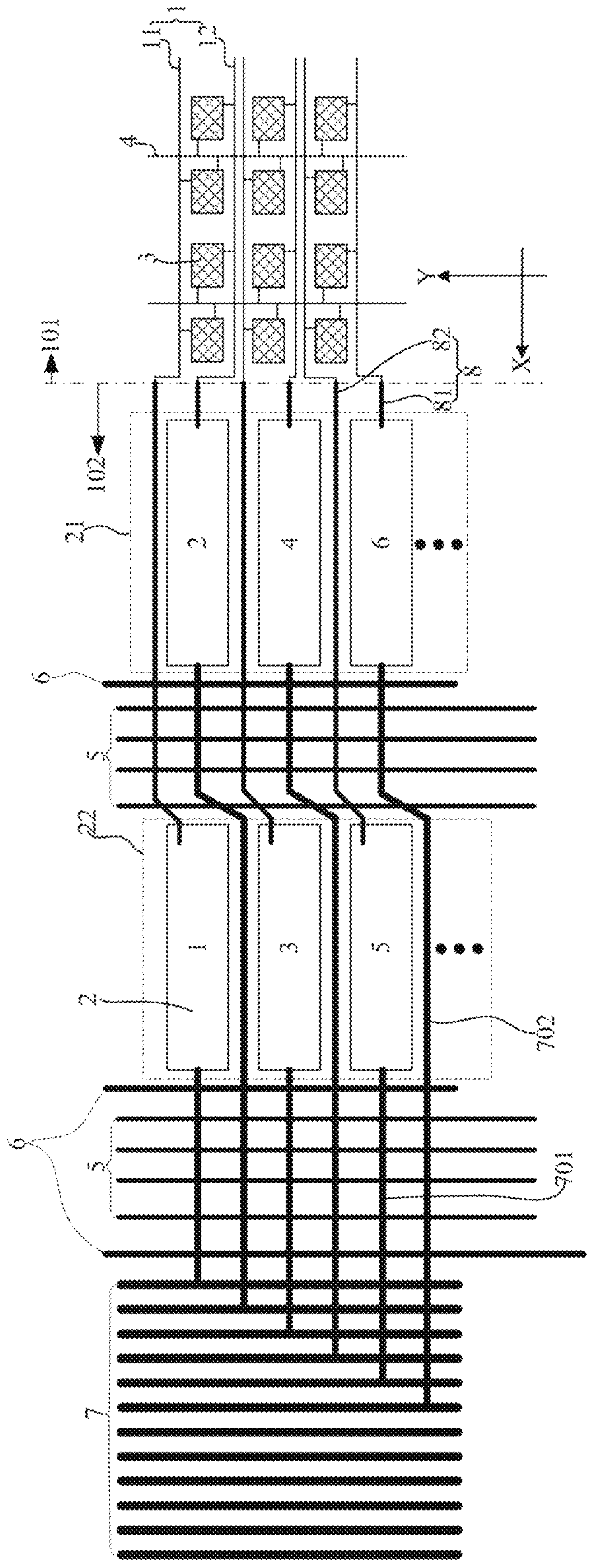
FIG. 11 is a schematic top view illustrating a display panel with a dual-gate and single-side driving mode according to an embodiment of the present disclosure.

An embodiment of the present disclosure further provides a display panel. Referring to FIG. 11, the plurality of shift registers 2 are distributed in a bezel area 102 on a first side of the display area 101, and include odd-numbered shift registers and even-numbered shift registers; the first group of shift registers 2 includes the even-numbered shift registers, and the second group of shift registers includes the odd-numbered shift registers; the display panel further includes a plurality of pixels 3 located in the display area 101 and arranged in an array; the plurality of gate lines 1 include a plurality of first gate lines 11 and a plurality of second gate lines 12; in the array, the odd-numbered pixels 3 in each row are connected to one first gate line 11, and the even-numbered pixels 3 in each row are connected to one second gate line 12; the odd-numbered shift register is connected to one end of the first gate line 11; and the even-numbered shift register is connected to one end of the second gate line 12. In some embodiments, the display panel further includes a plurality of data lines 4 respectively extending along the column direction of the array, and one data line 4 is correspondingly connected to two columns of pixels 3. That is, in the embodiment, the display panel is in a dual-gate driving and single-side driving mode.

Since the display panel uses the dual-gate driving mode, one data line 4 may be correspondingly connected to two columns of pixels 3, so that the number of data driving chips (source ICs) can be reduced by half, thereby reducing the manufacturing cost of the display panel.

Figure 12:
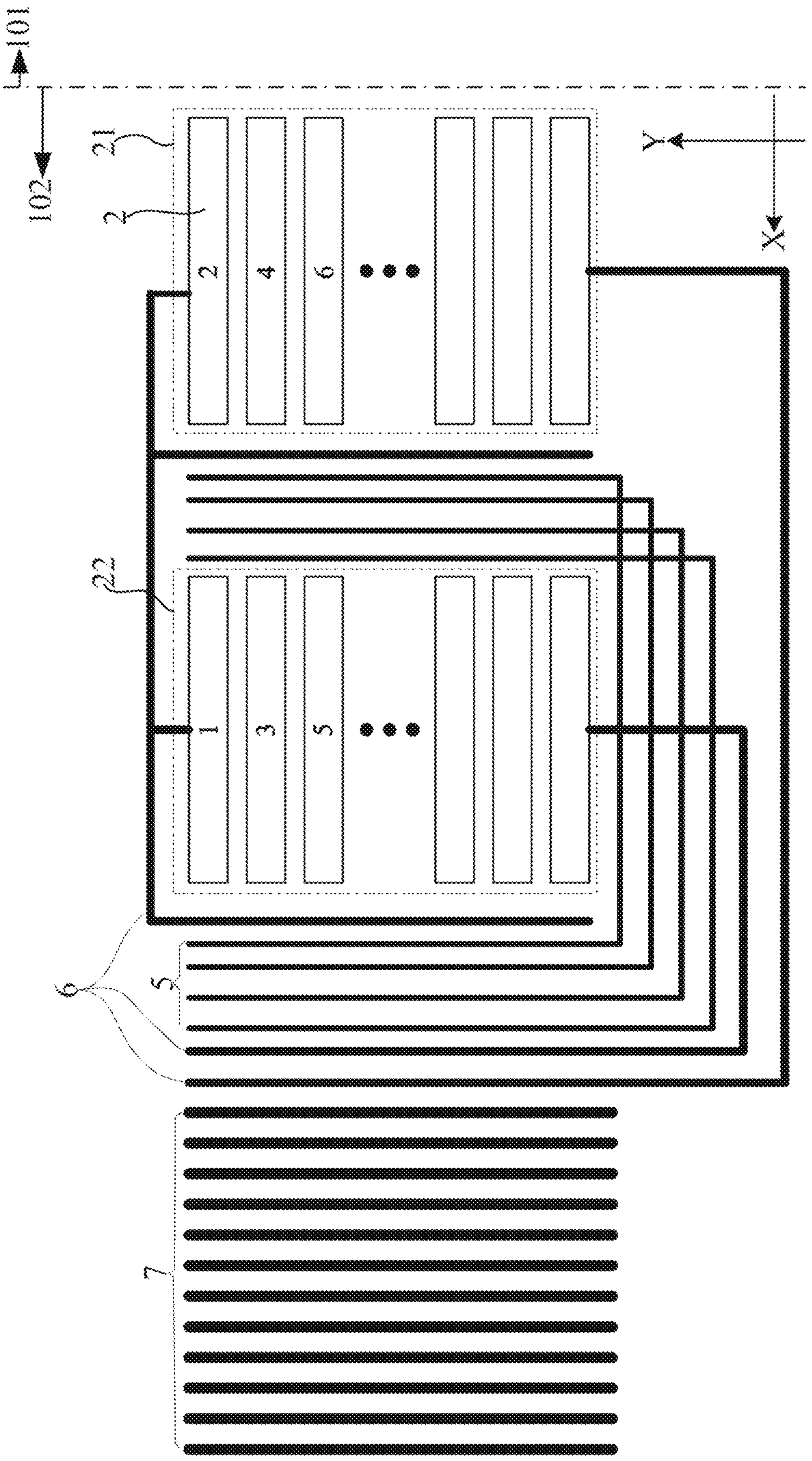
FIG. 12 is a schematic top view illustrating distribution of shift registers and signal lines in a bezel area of the display panel shown in FIG. 11.
Figure 13:
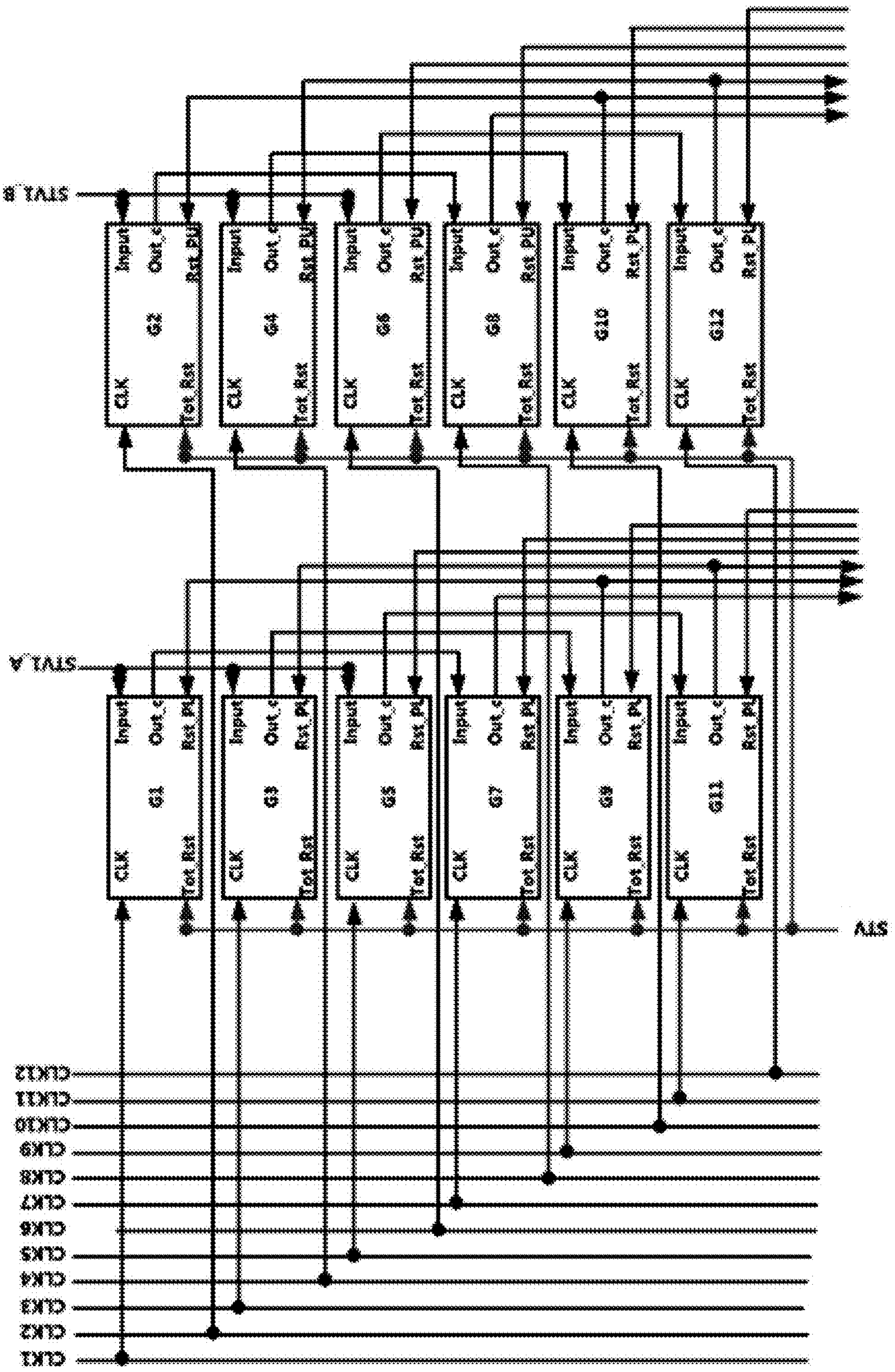
FIG. 13 is a schematic diagram of a gate driving circuit formed by cascading the shift registers in FIG. 7 of the display panel in FIG. 11.
Figure 14:
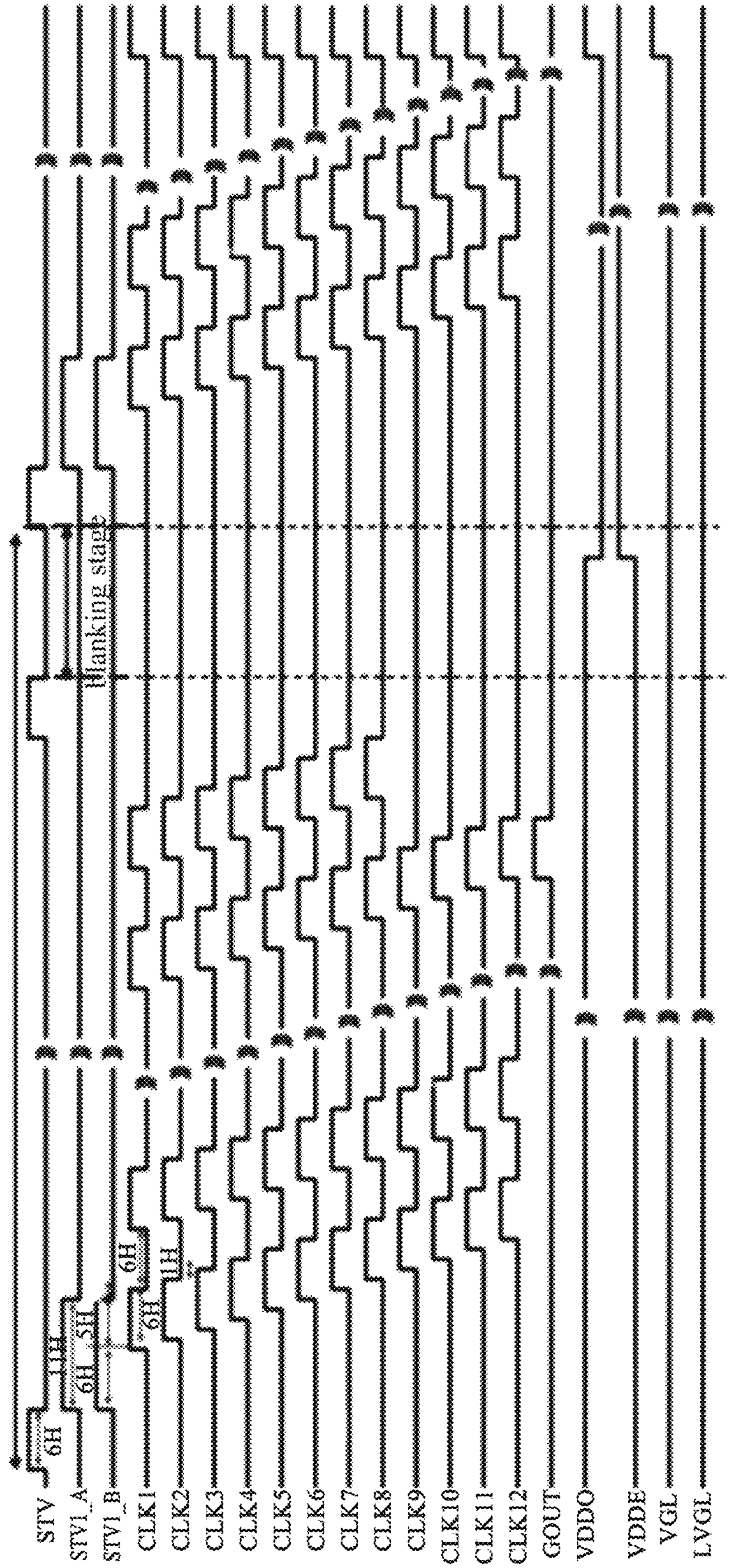
FIG. 14 is an operation timing diagram of the gate driving circuit in FIG. 13.

In some embodiments, for the dual-gate driving display panel in FIG. 11, the shift register 2 may also use the 21T1C circuit in FIG. 7. Referring to FIG. 4, FIG. 8 and FIG. 9, INPUT control signal lines 6 may be grouped, that is, the shift registers 2 in each group access a same INPUT control signal, and meanwhile, in cooperation with control of the clock signal of the clock signal line 7, the INPUT control signal line 6 controls the shift registers 2 to sequentially scan the first gate line 11 and the second gate line 12 of one row of pixels 3, thereby achieving normal display of one bezel of image at a refresh rate of 120 Hz. In some embodiments, based on the 21T1C circuit of the shift register in FIG. 7, referring to FIG. 12 to FIG. 14, the INPUT control signal lines 6 may not be grouped, that is, the shift registers 2 in each group are provided with different INPUT control signals, for example, the first group of shift registers are provided with one INPUT control signal (e.g., STV1_B), the second group of shift registers are provided with another INPUT control signal (e.g., STV1_A), and meanwhile, in cooperation with the control of the clock signal of the clock signal line 7, the two different INPUT control signals may control the shift registers 2 to scan the first gate line 11 and the second gate line 12 of one row of pixels 3 at the same time, thereby achieving normal display of one bezel of image at a refresh rate of 120 Hz. In some embodiments, two different INPUT control signals may also control the shift registers 2 to scan the first gate line 11 and the second gate line 12 of only the pixels 3 in odd-numbered rows or only the pixels in even-numbered rows, thereby achieving the control of the display of only the pixels in odd-numbered rows or only the pixels in even-numbered rows, and for example, such the control mode is used when the display panel displays some special images. In this way, by grouping or not grouping the INPUT control signal lines 6, the display panel can be compatible with various display modes.

Figure 15:
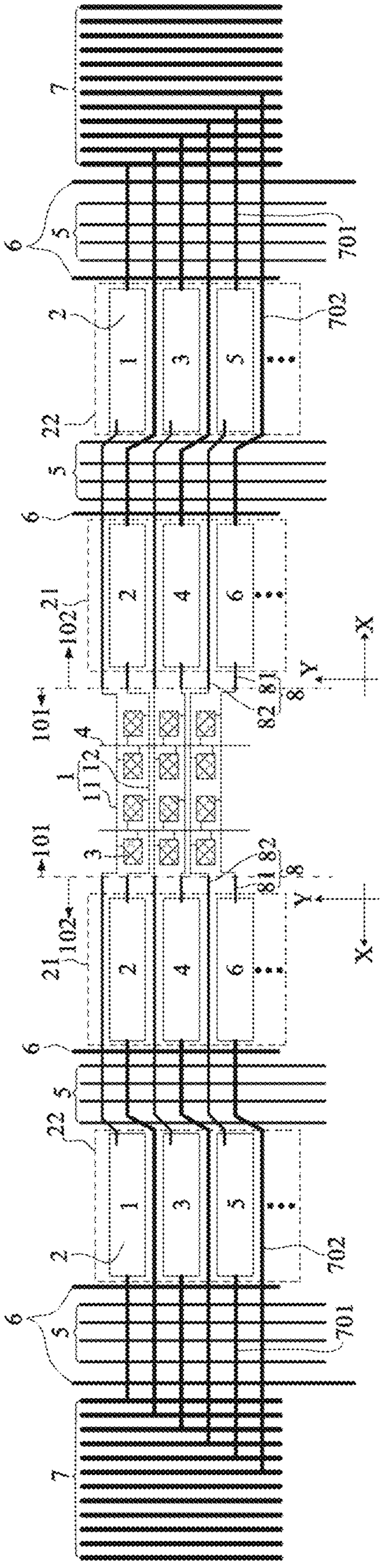
FIG. 15 is a schematic top view of a display panel with a dual-gate and dual-side driving mode according to an embodiment of the present disclosure.

An embodiment of the present disclosure further discloses a display panel. Referring to FIG. 15, based on the display panel shown in FIG. 11, the plurality of shift registers 2 are further distributed in a bezel area 102 of a second side of the display area 101; the bezel area 102 on the first side is opposite to the bezel area 102 on the second side; the plurality of shift registers 2 distributed in the bezel area 102 on the first side and the plurality of shift registers 2 distributed in the bezel area 102 on the second side are mirror-symmetrical by taking the display area 101 as a symmetry axis; the odd-numbered shift register distributed in the bezel area 102 on the second side is connected to the other end of the first gate line 11; and the even-numbered shift register distributed in the bezel area 102 on the second side is connected to the other end of the second gate line 12. In some embodiments, the display panel further includes a plurality of data lines 4 respectively extending along the column direction of the array, and each data line 4 is correspondingly connected to two columns of pixels 3. That is, in the embodiment, the display panel is in a dual-gate driving and dual-side driving mode.

The display panel uses the dual-side driving mode. Compared with the display panel with the single-side driving mode, the dual-side driving can effectively avoid signal attenuation in the process that the gate scanning signal is transmitted from one end of the gate line to the other end of the gate line, so that consistency of the gate scanning signal is ensured, thereby improving brightness uniformity of the display image of the display panel.

In some embodiments, the plurality of power signal lines 5 are distributed in the bezel area 102 on the first side and the bezel area 102 on the second side; the plurality of control signal lines 6 are distributed in the bezel area 102 on the first side and the bezel area 102 on the second side; the plurality of power signal lines 5 distributed in the bezel area 102 on the first side and the plurality of power signal lines 5 distributed in the bezel area 102 on the second side are mirror-symmetrical by taking the display area 101 as a symmetry axis; and the control signal lines 6 distributed in the bezel area 102 on the first side and the control signal lines 6 distributed in the bezel area 102 on the second side are mirror-symmetrical by taking the display area 101 as a symmetry axis.

In some embodiments, the plurality of clock signal lines 7 are distributed in the bezel area 102 on the first side and the bezel area 102 on the second side; and the plurality of clock signal lines 7 distributed in the bezel area 102 on the first side and the plurality of clock signal lines 7 distributed in the bezel area 102 on the second side are mirror-symmetrical by taking the display area 101 as a symmetry axis.

In some embodiments, the first connection lines 701, the second connection lines 702, the first output lines 81 and the second output lines 82 are respectively distributed in the bezel area 102 on the first side and the bezel area 102 on the second side; the first connection lines 701 distributed in the bezel area 102 on the first side and the first connection lines 702 distributed in the bezel area 102 on the second side are mirror-symmetrical by taking the display area 101 as a symmetry axis; the second connection lines 702 distributed in the bezel area 102 on the first side and the second connection lines 702 distributed in the bezel area 102 on the second side are mirror-symmetrical by taking the display area 101 as a symmetry axis; the first output lines 81 distributed in the bezel area 102 on the first side and the first output lines 81 distributed in the bezel area 102 on the second side are mirror-symmetrical by taking the display area 101 as a symmetry axis; and the second output lines 82 distributed in the bezel area 102 on the first side and the second output lines 82 distributed in the bezel area 102 on the second side are mirror-symmetrical by taking the display area 101 as a symmetry axis.

In the display panel provided by the embodiment of the present disclosure, the shift registers located in the bezel area on any one side of the display panel are grouped, all groups of shift registers in the bezel area on any one side are sequentially arranged along the first direction away from the display area, and the shift registers in each group are sequentially arranged along the second direction. With such arrangement, it can be ensured that the bezel area has enough space to accommodate a large number of shift registers, and a case of insufficient space of the bezel area resulted from that the large number of shift registers are arranged according to the conventional arrangement manner is avoided, so that the bezel area can meet the arrangement requirement of the large number of shift registers.

An embodiment of the present disclosure further provides a display device, which includes the display panel in any of the above embodiments.

The display panel provided by the embodiment of the present disclosure may be any product or component with a display function, such as an LCD panel, an LCD television, an OLED panel, an OLED television, a display, a mobile phone, a navigator, and the like.

It should be understood that the above embodiments are merely exemplary embodiments that are employed to illustrate the principles of the present disclosure, and that the present disclosure is not limited thereto. Various changes and modifications may be made by those skilled in the art without departing from the spirit and essence of the present disclosure, and should be considered to fall within the protection scope of the present disclosure.

What is claimed is:

1. A display panel, comprising:

a display area and a bezel area at a periphery of the display area;

a plurality of gate lines extending from the display area to the bezel area;

a plurality of shift registers in the bezel area on at least one side of the display panel and connected to the plurality of gate lines in one-to-one correspondence; wherein the plurality of shift registers on the bezel area on any one side of the display panel are divided into at least two groups which are sequentially arranged along a first direction away from the display area; the shift registers in each group are sequentially arranged along a second direction, and an angle between the second direction and the first direction is greater than 0°;

wherein the display panel further comprises: a plurality of power signal lines and a plurality of control signal lines located in the bezel area and respectively electrically connected to the shift registers, wherein the plurality of power signal lines are divided into at least two groups; in the bezel area on a side where the shift registers are located, each group of power signal lines is located on a side of one corresponding group of shift registers, in one-to-one correspondence, away from the display area, and is electrically connected to the corresponding group of shift registers in one-to-one correspondence, and the plurality of control signal lines are divided into at least two groups; and in the bezel area on the side where the shift registers are located, each group of control signal lines is located on a side of one corresponding group of shift registers, in one-to-one correspondence, away from the display area, and is electrically connected to the corresponding group of shift registers in one-to-one correspondence;

wherein the different first connection lines comprise a first connection line which comprises a first body part and a first compensation part which are connected, the first body part is a straight line extending along the first direction, and the first compensation part is a curved line with a main body extending along the first direction, and the first compensation parts of different first connection lines have a same length;

wherein the different second connection lines comprise a second connection line which is a straight line extending along the first direction; and the first connection line and the second connection line have a same length;

wherein the first compensation partis located in a gap between the power signal line, the control signal line, and the clock signal line, which are electrically connected to the second group of shift registers.

2. The display panel of claim 1, wherein in the bezel area on the side where the shift registers are located, the power signal lines and the control signal lines both extend along the second direction.

3. The display panel of claim 2, wherein input terminals of each group of power signal lines are electrically connected, and output terminals of each group of power signal lines are electrically connected, and input terminals of each group of control signal lines are electrically connected, and output terminals of each group of control signal lines are electrically connected.

4. The display panel of claim 3, further comprising a plurality of clock signal lines located in the bezel area and electrically connected to the shift registers, respectively; wherein on the side where the shift registers are located, the plurality of clock signal lines are located on a side of the shift registers away from the display area, and do not overlap the power signal lines and the control signal lines.

5. The display panel of claim 4, wherein in the bezel area on the side where the shift registers are located, the plurality of clock signal lines extend along the second direction.

6. The display panel of claim 1, wherein the plurality of shift registers in the bezel area on any one side of the display panel are divided into a first group and a second group which are sequentially arranged along the first direction away from the display area, the plurality of clock signal lines comprise a first set of clock signal lines and a second set of clock signal lines, in the bezel area on the side where the shift registers are located, different clock signal lines in the first set are electrically connected to the shift registers in the second group through different first connection lines, respectively, and different clock signal lines in the second set respectively extend through gaps between every two adjacent shift registers in the second group and are respectively electrically connected to the shift registers in the first group, through different second connection lines in one-to-one correspondence.

7. The display panel of claim 1, wherein each shift register in the first group is electrically connected to a corresponding gate line through a different first output line, and each shift register in the second group respectively extends through a gap between two adjacent shift registers in the first group and is electrically connected to a corresponding gate line, through a different second output line in one-to-one correspondence.

8. The display panel of claim 7, wherein the first output line comprises a second body part and a second compensation part which are connected, the second body part is a straight line extending along the first direction, the second compensation part is a curved line with a main body extending along the first direction, and the second compensation parts of different first output lines have a same length.

9. The display panel of claim 8, wherein the second output line is a straight line extending along the first direction, and the first output line and the second output line have a same length.

10. The display panel of claim 9, wherein the second compensation part is located in a gap between the first group of shift registers and the display area.

11. The display panel of claim 10, wherein the plurality of shift registers are distributed in a bezel area on a first side of the display area, the plurality of shift registers comprise odd-numbered shift registers and even-numbered shift registers, the first group of shift registers comprises the even-numbered shift registers, and the second group of shift registers comprises the odd-numbered shift registers, the display panel further comprises a plurality of pixels located in the display area and arranged in an array, the plurality of gate lines comprises a plurality of first gate lines and a plurality of second gate lines, in the array, odd-numbered pixels in each row are connected to one of the first gate lines, and even-numbered pixels in each row are connected to one of the second gate lines, and the odd-numbered shift registers are connected to one ends of the first gate lines, and the even-numbered shift registers are connected to one ends of the second gate lines.

12. The display panel of claim 11, wherein the plurality of shift registers are further distributed in a bezel area on a second side of the display area, the bezel area on the first side is opposite to the bezel area on the second side, the plurality of shift registers distributed in the bezel area on the first side and the plurality of shift registers distributed in the bezel area on the second side are mirror-symmetrical by taking the display area as a symmetry axis, and the odd-numbered shift registers distributed in the bezel area on the second side are connected to other ends of the first gate lines, and the even-numbered shift registers distributed in the bezel area on the second side are connected to other ends of the second gate lines.

13. The display panel of claim 12, wherein the plurality of power signal lines are distributed in the bezel area on the first side and the bezel area on the second side, and the plurality of control signal lines are distributed in the bezel area on the first side and the bezel area on the second side, the plurality of power signal lines distributed in the bezel area on the first side and the plurality of power signal lines distributed in the bezel area on the second side are mirror-symmetrical by taking the display area as a symmetry axis, and the control signal lines distributed in the bezel area on the first side and the control signal lines distributed in the bezel area on the second side are mirror-symmetrical by taking the display area as a symmetry axis.

14. The display panel of claim 13, wherein the plurality of clock signal lines are distributed in the bezel area on the first side and the bezel area on the second side, and the plurality of clock signal lines distributed in the bezel area on the first side and the plurality of clock signal lines distributed in the bezel area on the second side are mirror-symmetrical by taking the display area as a symmetry axis.

15. The display panel of claim 12, wherein the first connection lines, the second connection lines, the first output lines and the second output lines are respectively distributed in the bezel area on the first side and the bezel area on the second side, the first connection lines distributed in the bezel area on the first side and the first connection lines distributed in the bezel area on the second side are mirror-symmetrical by taking the display area as a symmetry axis, the second connection lines distributed in the bezel area on the first side and the second connection lines distributed in the bezel area on the second side are mirror-symmetrical by taking the display area as a symmetry axis, the first output lines distributed in the bezel area on the first side and the first output lines distributed in the bezel area on the second side are mirror-symmetrical by taking the display area as a symmetry axis, and the second output lines distributed in the bezel area on the first side and the second output lines distributed in the bezel area on the second side are mirror-symmetrical by taking the display area as a symmetry axis.

16. A display device, comprising the display panel of claim 1.

17. A display panel, comprising:

a display area and a bezel area at a periphery of the display area;

a plurality of gate lines extending from the display area to the bezel area;

a plurality of shift registers in the bezel area on at least one side of the display panel and connected to the plurality of gate lines in one-to-one correspondence; wherein the plurality of shift registers on the bezel area on any one side of the display panel are divided into at least two groups which are sequentially arranged along a first direction away from the display area; the shift registers in each group are sequentially arranged along a second direction, and an angle between the second direction and the first direction is greater than 0°;

wherein the display panel further comprises: a plurality of power signal lines and a plurality of control signal lines located in the bezel area and respectively electrically connected to the shift registers, wherein the plurality of power signal lines are divided into at least two groups; in the bezel area on a side where the shift registers are located, each group of power signal lines is located on a side of one corresponding group of shift registers, in one-to-one correspondence, away from the display area, and is electrically connected to the corresponding group of shift registers in one-to-one correspondence, and the plurality of control signal lines are divided into at least two groups; and in the bezel area on the side where the shift registers are located, each group of control signal lines is located on a side of one corresponding group of shift registers, in one-to-one correspondence, away from the display area, and is electrically connected to the corresponding group of shift registers in one-to-one correspondence;

wherein a first group of control signal lines of the at least two groups laterally surrounds the plurality of power signal lines.

18. The display panel of claim 17, wherein in the bezel area on the side where the shift registers are located, the power signal lines and the control signal lines both extend along the second direction.

19. The display panel of claim 18, wherein input terminals of each group of power signal lines are electrically connected, and output terminals of each group of power signal lines are electrically connected, and input terminals of each group of control signal lines are electrically connected, and output terminals of each group of control signal lines are electrically connected.

20. The display panel of claim 19, further comprising a plurality of clock signal lines located in the bezel area and electrically connected to the shift registers, respectively; wherein on the side where the shift registers are located, the plurality of clock signal lines are located on a side of the shift registers away from the display area, and do not overlap the power signal lines and the control signal lines.

* * * * *